(12) United States Patent
Steinmann et al.

(10) Patent No.: US 10,049,917 B2
(45) Date of Patent: Aug. 14, 2018

(54) FDSOI CHANNEL CONTROL BY IMPLANTED HIGH-K BURIED OXIDE

(71) Applicant: GLOBALFOUNDRIES Inc., Grand Cayman (KY)

(72) Inventors: Philipp Steinmann, Dresden (DE); Peter Javorka, Radeburg (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 25 days.

(21) Appl. No.: 15/269,023

(22) Filed: Sep. 19, 2016

(65) Prior Publication Data
US 2018/0082889 A1 Mar. 22, 2018

(51) Int. Cl.
| H01L 21/762 | (2006.01) |
| H01L 27/12 | (2006.01) |
| H01L 21/3115 | (2006.01) |
| H01L 21/02 | (2006.01) |
| H01L 29/786 | (2006.01) |

(52) U.S. Cl.
CPC .. *H01L 21/76283* (2013.01); *H01L 21/02321* (2013.01); *H01L 21/31155* (2013.01); *H01L 27/1203* (2013.01); *H01L 21/02181* (2013.01); *H01L 21/02183* (2013.01); *H01L 21/02186* (2013.01); *H01L 21/02189* (2013.01); *H01L 29/78603* (2013.01)

(58) Field of Classification Search
CPC ......... H01L 21/76283; H01L 21/02321; H01L 21/31155; H01L 27/1203; H01L 29/78603; H01L 21/02183; H01L 21/02186; H01L 21/02189; H01L 21/02181

USPC .................. 257/E27.112, 351, 347; 438/154
See application file for complete search history.

(56) References Cited

U.S. PATENT DOCUMENTS

| 6,352,905 | B1* | 3/2002 | Gauthier, Jr. ....... | H01L 21/7624 257/E21.561 |
| 6,624,476 | B1* | 9/2003 | Chan ..................... | H01L 21/84 257/347 |
| 8,241,998 | B2 | 8/2012 | Cayrefourcq | |
| 2004/0262647 | A1* | 12/2004 | Okihara .............. | H01L 27/1203 257/241 |
| 2012/0292705 | A1* | 11/2012 | Cheng ................. | H01L 27/1203 257/351 |
| 2013/0168823 | A1* | 7/2013 | Iijima ..................... | H01L 21/84 257/607 |
| 2013/0214356 | A1* | 8/2013 | Cheng .................... | H01L 21/84 257/347 |

(Continued)

*Primary Examiner* — Jonathan Han
(74) *Attorney, Agent, or Firm* — Ditthavong & Steiner, P.C.

(57) ABSTRACT

Methods of locally changing the BOX layer of a MOSFET device to a high-k layer to provide different Vts with one backside voltage and the resulting device are provided. Embodiments include providing a Si substrate having a BOX layer formed over the substrate and a SOI layer formed over the BOX layer; implanting a high current of dopants into at least one portion of the BOX layer; performing a high-temperature anneal of the BOX layer; forming first and second fully depleted silicon-on-insulator (FDSOI) transistors on the SOI layer, the first FDSOI transistors formed above either the BOX layer or the at least one portion of the BOX layer and the second FDSOI transistors formed above the at least one portion of the BOX layer; and applying a single voltage across a backside of the Si substrate.

15 Claims, 4 Drawing Sheets

(56) References Cited

U.S. PATENT DOCUMENTS

2014/0312423 A1\* 10/2014 Cheng ............ H01L 21/823807
                                                                                              257/351

\* cited by examiner

FDSOI CHANNEL CONTROL BY IMPLANTED HIGH-K BURIED OXIDE

TECHNICAL FIELD

The present disclosure relates to formation of metal oxide field effect transistor (MOSFET) devices for integrated circuits (ICs). The present disclosure is particularly applicable to MOSFET devices formed with a fully depleted silicon-on-insulator (FDSOI) channel.

BACKGROUND

FDSOI process technology includes a continuous buried oxide (BOX) layer common to all devices on a wafer. One of the core benefits of FDSOI is the ability to control threshold voltage (Vt) by controlling backside voltages. However, an IC device may include different devices, e.g., an input/output (I/O) device, etc., formed on the same wafer, which have different trade-offs for channel control, sub-threshold slope, and operating voltage. The device tradeoffs are typically set by adjustments to the gate oxide and threshold implants, but on FDSOI, this is also possible through bias to the backgate.

It would therefore be advantageous to have a methodology enabling formation of multiple devices with different Vts on a wafer with better channel control and the resulting device.

SUMMARY

An aspect of the present disclosure is a process of locally changing the dielectric constant, or k-value, of a BOX layer of a MOSFET device to provide different Vts with one backside voltage.

Another aspect of the present disclosure is a MOSFET device including a BOX layer having different k-values.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a silicon (Si) substrate having a BOX layer formed over the substrate and a silicon-on-insulator (SOI) layer formed over the BOX layer; implanting a high current of dopants into at least one portion of the BOX layer; performing a high-temperature anneal of the BOX layer; forming first and second fully depleted silicon-on-insulator (FDSOI) transistors on the SOI layer, the first FDSOI transistors formed above either the BOX layer or the at least one portion of the BOX layer and the second FDSOI transistors formed above the at least one portion of the BOX layer; and applying a single voltage across a backside of the Si substrate.

Aspects of the present disclosure include forming the BOX layer of silicon oxide ($SiO_x$, $1<x<3$). Other aspects include controlling a Vt of each of the first and second FDSOI transistors based on whether a FDSOI transistor is formed over the BOX layer or the at least one portion of the BOX layer and on a concentration of the implanted dopant in the at least one portion of the BOX layer underlying the FDSOI transistor. Further aspects include implanting the high current of dopants into the at least one portion of the BOX layer by: forming a photoresist layer over the SOI layer; patterning the photoresist layer; performing a high-current implant through the photoresist layer; and removing the photoresist layer prior to performing the high-temperature anneal. Other aspects include the at least one implanted portion of the BOX layer being implanted with different dopants under the first and second FDSOI transistors. Another aspect includes applying different voltages to the backside of the Si substrate based on different BOX regions above the substrate. Additional aspects include implanting a high current of multiple dopants of a same species with different implant energies into the at least one portion of the BOX layer. Other aspects include implanting the dopant at a dosage of 5e15 per centimeter squared ($cm^2$) to $1e17/cm^2$. Further aspects include selecting the dosage based on a desired Vt for the FDSOI transistor. Another aspect includes implanting multiple portions of the BOX layer, each portion at a different dosage for a different Vt. Additional aspects include the dopant being hafnium (Hf), zirconium (Zr), titanium (Ti), or tantalum (Ta).

Another aspect of the present disclosure is a MOSFET device including: a SOI layer over a Si substrate; first and second FDSOI transistors formed on the SOI layer; formed between the SOI layer and the Si substrate, wherein the BOX layer below the first FDSOI transistors is either implanted with a first dopant, forming a high-k layer, or is non-implanted, and the BOX layer below the second FDSOI transistors is implanted with a second dopant, forming a high-k layer, the first and second dopants being different; and a backgate region formed on a bottom surface of the substrate.

Aspects of the device include the BOX layer being $SiO_x$, $1<x<3$. Other aspects include the high-K layer being hafnium silicon oxide ($HfSiO_x$, $1<x<3$), zirconium silicon oxide ($ZrSiO_x$, $1<x<3$), titanium silicon oxide ($TiSiO_x$, $1<x<3$), or tantalum silicon oxide ($TaSiO_x$, $1<x<3$). Further aspects include the $HfSiO_x$, $1<x<3$, $ZrSiO_x$, $1<x<3$, $TiSiO_x$, $1<x<3$, or $TaSiO_x$, $1<x<3$ layer being formed with a dosage of $5e15/cm^2$ to $1e17/cm^2$ of Hf, Zr, Ti, Ta, respectively.

A further aspect of the present disclosure is a method including: providing a Si substrate having a $SiO_x$, $1<x<3$ BOX layer formed over the substrate and a SOI layer formed over the $SiO_x$, $1<x<3$ BOX layer, the $SiO_x$, $1<x<3$ BOX layer having a substantially uniform thickness; forming a photoresist layer over the SOI layer; patterning the photoresist layer; implanting at least one portion of the $SiO_x$, $1<x<3$ BOX layer with a Hf, Zr, Ti, Ta dopant at a dosage of 5e15 per $cm^2$ to $1e17/cm^2$ through the patterned photoresist layer; stripping the photoresist layer; annealing the $SiO_x$, $1<x<3$ BOX layer; forming shallow trench isolation (STI) regions through the SOI and/or $SiO_x$, $1<x<3$ BOX layers; forming first FDSOI transistors on the SOI layer above either the $SiO_x$, $1<x<3$ BOX layer or the at least one implanted portion of the $SiO_x$, $1<x<3$ BOX layer; forming second FDSOI transistors on the SOI layer above the at least one implanted portion of the $SiO_x$, $1<x<3$ BOX layer; and applying a single voltage across a backside of the Si substrate.

Aspects of the present disclosure include controlling a Vt of each of the first and second FDSOI transistors based on whether a FDSOI is formed over the $SiO_x$, $1<x<3$ BOX layer or the at least one portion of the $SiO_x$, $1<x<3$ BOX layer and on a concentration of the implanted dopant in the $SiO_x$, $1<x<3$ BOX layer underlying the FDSOI transistor. Further aspects include selecting the dosage based on a desired Vt for the FDSOI transistor. Another aspect includes implanting multiple portions of the $SiO_x$, $1<x<3$ BOX layer, each portion at a different dosage for a different Vt. Additional aspects include the at least one implanted portion of the $SiO_x$, $1<x<3$ BOX layer being implanted with different dopants under the first and second FDSOI transistors.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of respective trade-offs for channel control, subthreshold slope, and operating voltage attendant upon forming a common BOX layer for different FDSOI MOSFET devices.

Methodology in accordance with embodiments of the present disclosure includes providing a Si substrate having a BOX layer formed over the substrate and a SOI layer formed over the BOX layer. A high current of dopants is implanted into at least one portion of the BOX layer. A high-temperature anneal of the BOX layer is performed. First and second FDSOI transistors are formed on the SOI layer, the first FDSOI transistors are formed above either the BOX layer or the at least one portion of the BOX layer and the second FDSOI transistors are formed above the at least one portion of the BOX layer. A single voltage is applied across a backside of the Si substrate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects.

Accordingly, the drawings and description are to be regarded as illustrative in nature, and not as restrictive.

Figure 1:
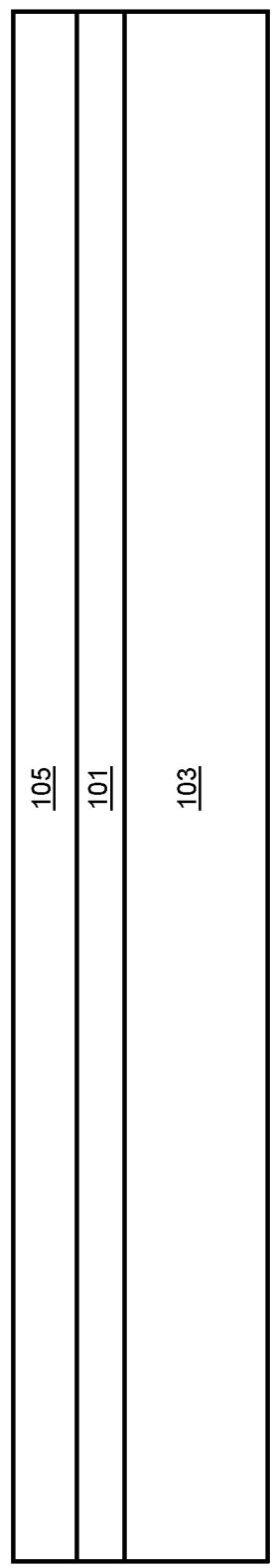
FIGS. 1 through 4 schematically illustrate a process of locally changing the BOX layer of a MOSFET device to a high-k layer to provide different Vts with one backside voltage, in accordance with an exemplary embodiment.
Figure 2:
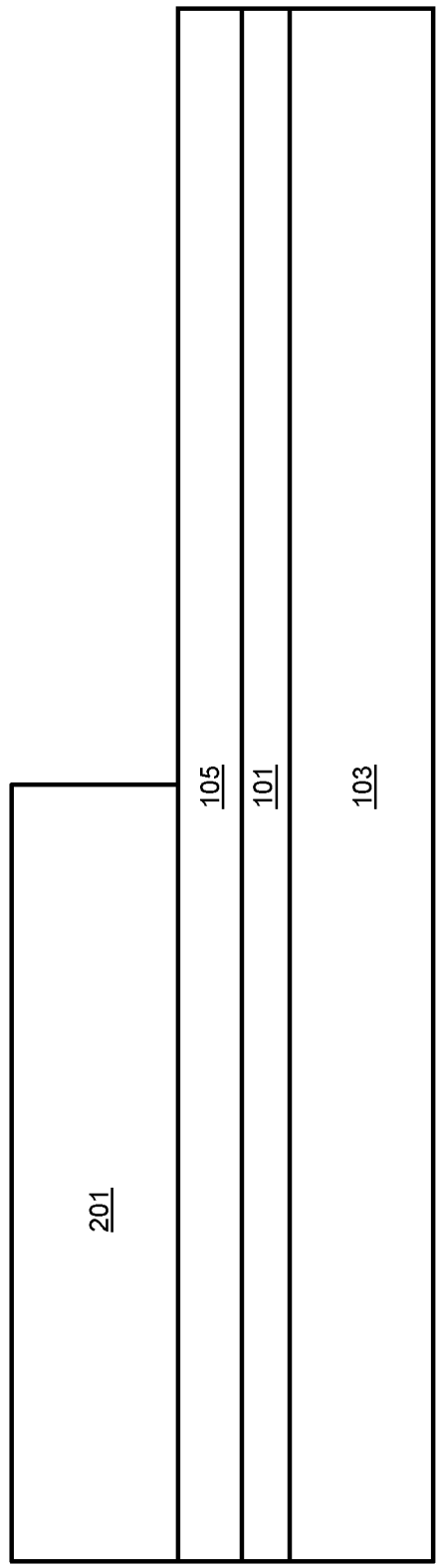

FIGS. 1 through 4 (cross-sectional views) schematically illustrate a process of locally changing the BOX layer of a MOSFET device to a high-k layer to provide different Vts with one backside voltage, in accordance with an exemplary embodiment. Adverting to FIG. 1, a BOX layer 101 is formed, e.g., to a thickness of 1 nm to 100 nm, over a bulk Si substrate 103. The BOX layer 101 may be formed, e.g., of $SiO_x$, $1<x<3$, e.g., silicon dioxide ($SiO_2$), oxygen ($O_2$) deficient $SiO_x$ ($SiO_x$, $1<x<2$), or Si deficient $SiO_x$ ($SiO_x$, $2<x<3$). A SOI layer 105 is formed over the BOX layer 101. The method may begin by providing an already formed SOI substrate including substrate 103, BOX layer 101, and SOI layer 105. Next, a photoresist layer 201 is formed over the SOI layer 105 and patterned, as depicted in FIG. 2.

Figure 3:
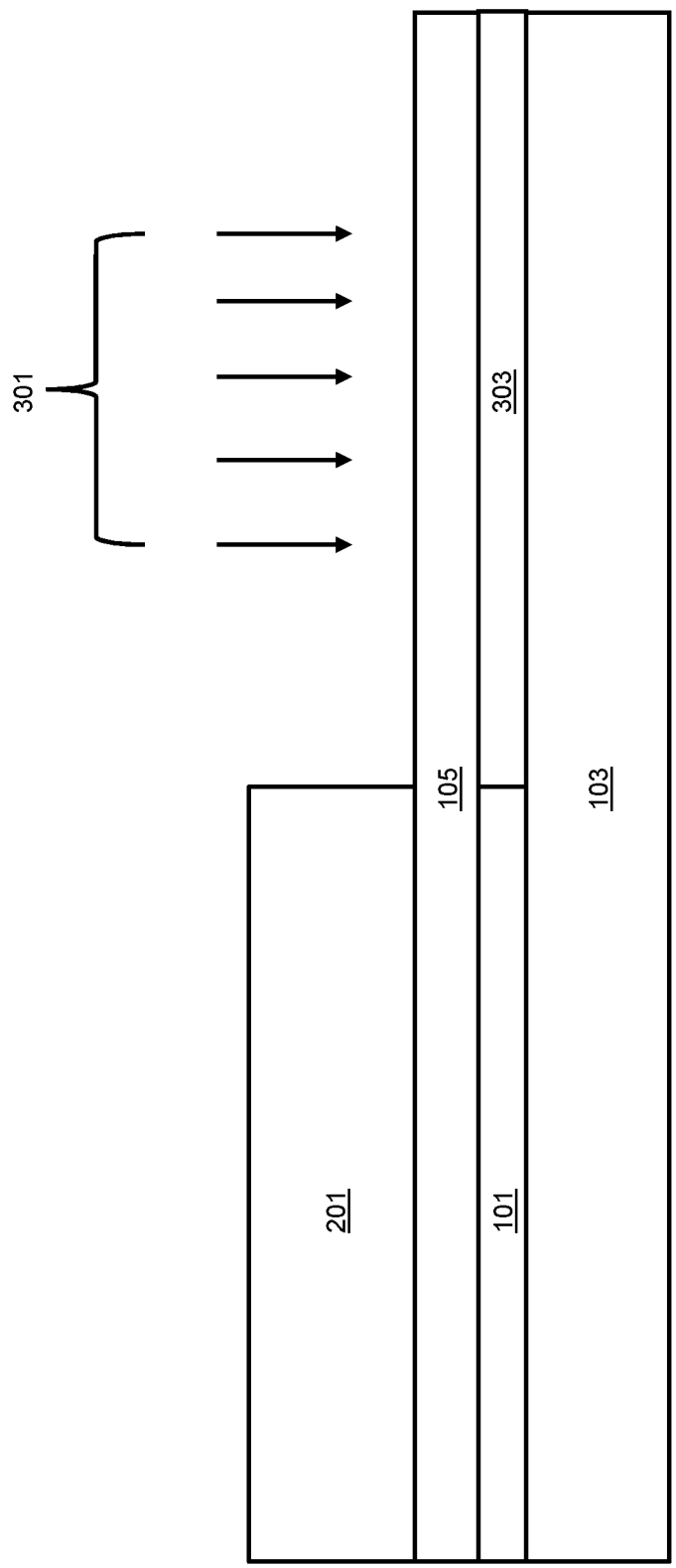

Adverting to FIG. 3, a high-current implant is performed through the photoresist layer 201 (as illustrated by the arrows 301) to implant at least one portion of the BOX layer 101 with a dopant, e.g., Hf, Zr, Ti, or Ta. As a result, a high-k BOX layer 303 is formed. The high-k BOX layer 303 may be formed, e.g., of $HfSiO_x$, $1<x<3$, $ZrSiO_x$, $1<x<3$, $TiSiO_x$, $1<x<3$, $TaSiO_x$, $1<x<3$; $HfSiO_x$, $1<x<2$, $ZrSiO_x$, $1<x<2$, $TiSiO_x$, $1<x<2$, $TaSiO_x$, $1<x<2$; or $HfSiO_x$, $2<x<3$, $ZrSiO_x$, $2<x<3$, $TiSiO_x$, $2<x<3$, $TaSiO_x$, $2<x<3$, depending on the dopant and on the composition of the BOX layer 101. The energy of the high-current implant is specifically adjusted to peak the implant in the BOX layer 101. The dopant is implanted, e.g., at a dosage of 5e15 $cm^2$ to 1e17/$cm^2$, and the particular dosage is selected based on a desired Vt for a subsequently formed FDSOI transistor. The higher the dose selected, the higher the Vt of the subsequently formed gate. Further, multiple portions of the BOX layer may be implanted at different dosages (not shown for illustrative convenience) to achieve a different Vt for each subsequently formed FDSOI transistor. Thereafter, the photoresist layer 201 is stripped, and a high-temperature anneal of the BOX layers 101 and 303 is performed, e.g., at a temperature of 1000° C. to 1400° C. Alternatively, multiple high-current implants of the same species, e.g., Hf, Zr, Ti, or Ta, could be performed with different implant energies to evenly dope the BOX layer 101.

A photoresist layer (not shown for illustrative purposes) could also be formed over the SOI layer 105 and patterned to protect the high-k BOX layer 303. Thereafter, a second high-current implant (not shown for illustrative convenience) could be performed through the photoresist layer to implant the non-implanted portion of the BOX layer 101 with a dopant different from the dopant that was used to implant the BOX layer 303, e.g., Hf, Zr, Ti, or Ta. Consequently, two different high-k BOX layers may be formed, thereby covering the entire wafer.

Figure 4:
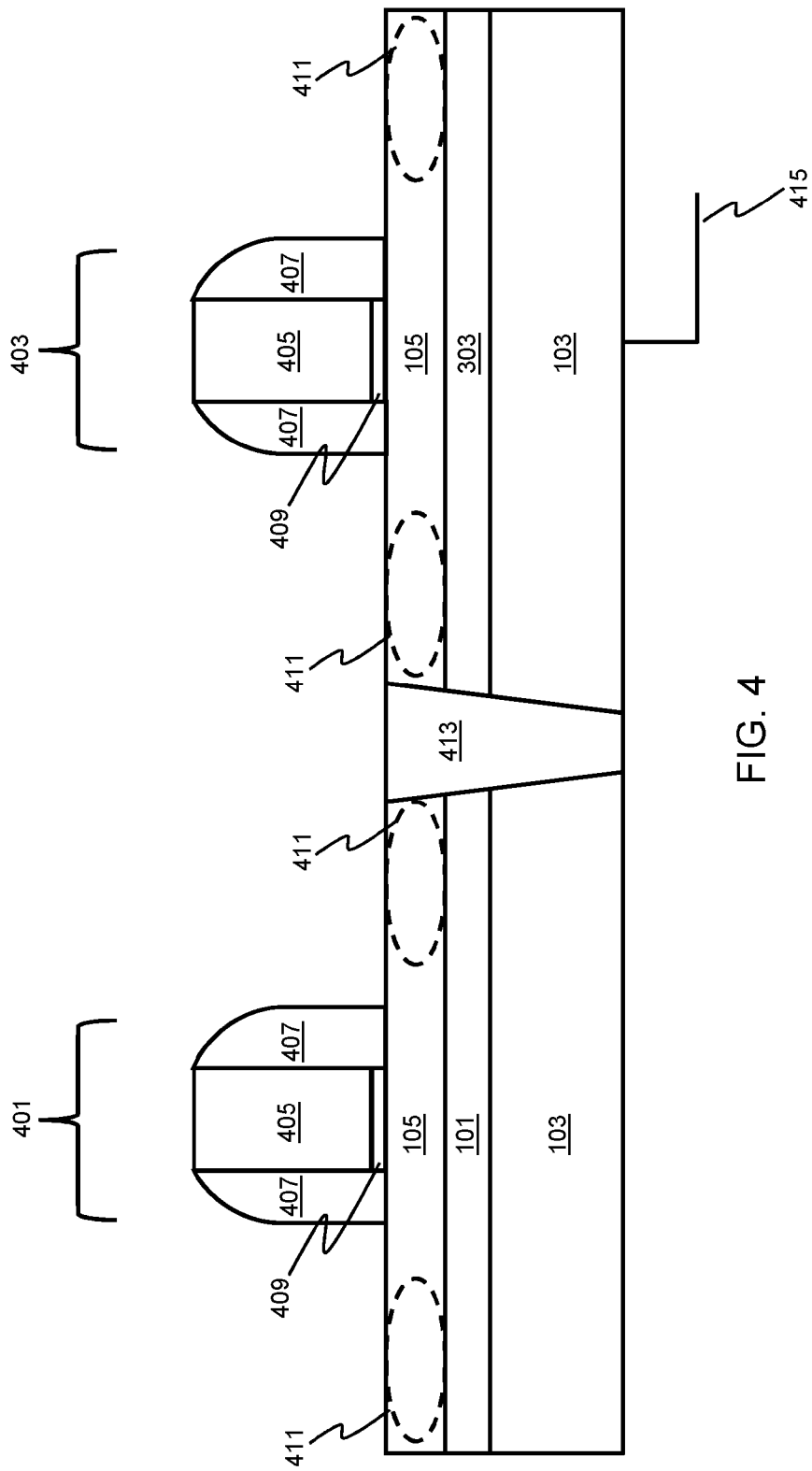

FDSOI transistors 401 and 403 are then formed simultaneously on the SOI layer 105. The FDSOI transistor 401 is formed above either a non-implanted portion of the BOX layer 101 or an implanted portion (not shown for illustrative convenience) and the FDSOI transistor 403 is formed on the SOI layer 105 above an implanted portion of the BOX layer 101, e.g., the high-k BOX layer 303, as depicted in FIG. 4. In the instance where the FDSOI transistors 401 and 403 are both formed on the SOI layer 105 over implanted portions of the BOX layer 101, the implanted portions of the BOX layer 101 would not be formed from the same dopants. The FDSOI transistors 401 and 403 each include a gate 405, spacers 407, and a dielectric layer 409. It should be noted that the FDSOI transistors 401 and 403 are rudimentarily depicted for illustrative purposes and are not complete.

Thereafter, S/D regions 411 are formed on opposite sides of each FDSOI transistor 401 and 403. A STI region 413 may also be formed through the SOI layer 105 and the non-implanted and/or implanted portions of the BOX layer. Last, a single voltage may be applied across a backside of the Si substrate 103 through the backgate 415 to provide different Vts for the FDSOI transistors 401 and 403. Alternatively, different back biases may be applied in combination with different BOX regions to provide different Vts.

The embodiments of the present disclosure can achieve several technical effects including locally varying backgate control of the channel; achieving a wider range for Vt control (from ultra-high Vt (uHVt) to ultra-low Vt (uLVt)), higher sensitivity of Vt change to backgate voltage, and lower subthreshold slope; and enabling the k-value of the BOX layer to be varied early in the process flow through implantation of Hf, Zr, Ti, or Ta. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any IC devices with MOSFETs having a FDSOI channel.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   providing a silicon (Si) substrate having a buried oxide (BOX) layer formed over the substrate and a silicon-on-insulator (SOI) layer formed over the BOX layer;
   implanting a high current of dopants into at least one portion of the BOX layer;
   performing a high-temperature anneal of the BOX layer;
   forming first and second fully depleted silicon-on-insulator (FDSOI) transistors on the SOI layer, wherein the BOX layer below the first FDSOI transistors is either implanted with a first dopant, forming a high-k layer, or is non-implanted, and the BOX layer below the second FDSOI transistors is implanted with a second dopant, forming a high-k layer, the first and second dopants being different; and
   applying a single voltage across a backside of the Si substrate,
   wherein the second dopant comprises hafnium (Hf), zirconium (Zr), titanium (Ti), or tantalum (Ta).

2. The method according to claim 1, comprising forming the BOX layer of silicon oxide ($SiO_x$, $1<x<3$).

3. The method according to claim 1, comprising controlling a threshold voltage (Vt) of each of the first and second FDSOI transistors based on whether a FDSOI transistor is formed over the BOX layer or the at least one portion of the BOX layer and on a concentration of the implanted dopants in the at least one portion of the BOX layer underlying the FDSOI transistor.

4. The method according to claim 1, comprising implanting the high current of dopants into the at least one portion of the BOX layer by:
   forming a photoresist layer over the SOI layer;
   patterning the photoresist layer;
   performing a high-current implant through the photoresist layer; and
   removing the photoresist layer prior to performing the high-temperature anneal.

5. The method according to claim 1, wherein the at least one implanted portion of the BOX layer is implanted with different dopants under the first and second FDSOI transistors.

6. The method according to claim 1, comprising applying different voltages to the backside of the Si substrate based on different BOX regions above the substrate.

7. The method according to claim 1, comprising implanting a high current of multiple dopants of a same species with different implant energies into the at least one portion of the BOX layer.

8. The method according to claim 1, comprising implanting the dopant at a dosage of 5e15 per centimeter squared ($cm^2$) to $1e17/cm^2$.

9. The method according to claim 8, comprising selecting the dosage based on a desired Vt for the FDSOI transistor.

10. The method according to claim 1, comprising implanting multiple portions of the BOX layer, each portion at a different dosage for a different Vt.

11. A method comprising:
    providing a silicon (Si) substrate having a silicon oxide ($SiO_x$, $1<x<3$) buried oxide (BOX) layer formed over the substrate and a SOI layer formed over the $SiO_x$, $1<x<3$ BOX layer, the $SiO_x$, $1<x<3$ BOX layer having a substantially uniform thickness;
    forming a photoresist layer over the SOI layer;
    patterning the photoresist layer;
    implanting at least one portion of the $SiO_x$, $1<x<3$ BOX layer with a dopant comprising hafnium (Hf), zirconium (Zr), titanium (Ti), or tantalum (Ta) at a dosage of 5e15 per centimeter square ($cm^2$) to $1e17/cm^2$ through the patterned photoresist layer to form a high-k BOX layer;
    stripping the photoresist layer;
    annealing the $SiO_x$, $1<x<3$ BOX layer;
    forming shallow trench isolation (STI) regions through the SOI and/or the $SiO_x$, $1<x<3$ BOX layers;
    forming first and second fully depleted silicon-on-insulator (FDSOI) transistors on the SOI layer, the first FDSOI transistors formed above either the $SiO_x$, $1<x<3$ BOX layer or the at least one implanted portion of the $SiO_x$, $1<x<3$ BOX layer and the second FDSOI transistors formed above the at least one implanted portion of the $SiO_x$, $1<x<3$ high-k BOX layer; and
    applying a single voltage across a backside of the Si substrate.

12. The method according to claim 11, comprising controlling a threshold voltage (Vt) of each of the first and second FDSOI transistors based on whether a FDSOI transistor is formed over the $SiO_x$, $1<x<3$ BOX layer or the at least one portion of the $SiO_x$, $1<x<3$ BOX layer and on a concentration of the implanted dopant in the $SiO_x$, $1<x<3$ BOX layer underlying the FDSOI transistor.

13. The method according to claim 11, comprising selecting the dosage based on a desired Vt for the FDSOI transistor.

14. The method according to claim 11, comprising implanting multiple portions of the $SiO_x$, $1<x<3$ BOX layer, each portion at a different dosage for a different Vt.

15. The method according to claim 11, wherein the at least one implanted portion of the $SiO_x$, $1<x<3$ BOX layer is implanted with different dopants under the first and second FDSOI transistors.

\* \* \* \* \*